United States Patent [19]

Imai

[11] 4,051,428
[45] Sept. 27, 1977

[54] CURRENT CONTROL CIRCUIT WITH CURRENT PROPORTIONAL CIRCUIT

[75] Inventor: Kunio Imai, Kodaira, Japan

[73] Assignee: Hitachi, Ltd., Japan

[21] Appl. No.: 666,416

[22] Filed: Mar. 12, 1976

[30] Foreign Application Priority Data

Mar. 12, 1975  Japan ................................ 50-29021

[51] Int. Cl.² .................... G05F 3/08; H03K 5/01; H03K 13/22; H03D 13/00
[52] U.S. Cl. ........................................ 323/4; 307/261; 328/34; 331/8; 331/27; 332/9 T
[58] Field of Search ................. 307/261, 262; 323/1, 323/4, 19; 328/34; 330/30 D; 331/8, 27, 108 D; 332/9 T

[56] References Cited
U.S. PATENT DOCUMENTS

| 3,610,955 | 10/1971 | Blaser et al. ...................... 323/1 UX |
| 3,821,658 | 6/1974 | Hoeft ...................................... 331/8 |
| 3,846,645 | 11/1974 | Kim et al. ......................... 307/262 X |
| 3,909,738 | 9/1975 | Niimi ................................. 330/30 D |
| 3,939,432 | 2/1976 | Nelson .............................. 307/261 X |
| 3,946,330 | 3/1976 | Takahashi ................................ 331/8 |
| 3,956,700 | 5/1976 | Condon ............................ 330/30 D |

Primary Examiner—A. D. Pellinen
Attorney, Agent, or Firm—Craig & Antonelli

[57] ABSTRACT

A current control circuit comprises a current proportional circuit having two terminals, the current of one terminal being a proportional relationship with the current of the other terminal. An output terminal coupled with the current proportional circuit and a load through which a controlled current flows, and a constant current source. A steering circuit to which a switching signal is applied, is provided between the two terminals of the current proportional circuit and the constant current source, in order to couple the constant current source to one of the two terminals in response to the switching signal.

7 Claims, 9 Drawing Figures

CURRENT CONTROL CIRCUIT WITH CURRENT PROPORTIONAL CIRCUIT

BACKGROUND OF THE INVENTION

This invention relates to a current control circuit with a current proportional circuit and more particularly to a current control circuit in which a flowing direction of a current is switched by a switching signal and the values of the switched current have a proportional relationship.

A current control circuit which an output signal is controlled by an input binary signal is applicable to various types of circuits, such as a digital-analog converter, a phase comparator and a unipolar-bipolar converter. When an input binary signal is supplied to an input terminal of the current control circuit, a current flowing a load coupled with an output terminal of the current control circuit is switched in a direction. However, it has been difficult to maintain a propotional relationship between the values of the switched current in a conventional current control circuit. Further, the configuration of the current control circuit has been complicated so that is has been unsuited in an integrated circuit and high in cost.

SUMMARY OF THE INVENTION

It is therefore an object of this invention to provide new and improved current control circuit which the values of the output current are in a proportional relationship.

It is another object of this invention to provide new and improved current control circuit which is applicable to various types of circuits by changing a type of a load coupled with the output terminal thereof.

It is still another object of this invention to provide new and improved current control circuit being capable of an integration.

In order to achieve the above objects, a current control circuit of this invention includes a current proportional circuit, a constant current source, a load coupled with the current proportional circuit and a steering circuit. The steering circuit to which a switching signal is applied, is provided between the current proportional circuit and a constant current source in order to control the connection therebetween in response to the switching signal so that the controlled current flows the load. This current control circuit is applicable to various types of circuits by changing the type of the load, as will be explained below.

The above and other objects, and advantages of this invention will be apparently understood in a detail description hereinafter in connection with the following drawing.

BRIEF DESCRIPTION OF THE DRAWING

FIG. 4b is a diagram showing a time chart to explain the modified embodiment in FIG. 4a.

FIG. 5b is a diagram showing a time chart to explain the modified embodiment in FIG. 5a.

FIG. 6b is a diagram showing a time chart to explain the modified embodiment in FIG. 6a.

DESCRIPTION OF THE PREFERRED EMBODIMENTS

Figure 1:
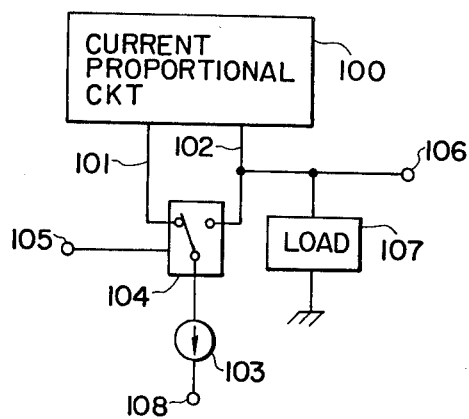
FIG. 1 is a schematic block diagram to explain a principle of this invention.

Referring now to FIG. 1, a current proportional circuit 100 provides two terminals 101 and 102. A constant current source 103 is coupled with the two terminals 101 and 102 through a steering circuit 104 to which switching signals are applied from a terminal 105. An output terminal 106 is connected to the terminal 102 of the current proportional circuit 100, with which a load 107 is coupled. A reference numeral 108 is a voltage terminal. The switching signals are, for example, of two levels such as a binary signal.

The operation of this current control circuit will be explained. When the one level signal of the switching signals is applied to the steering circuit 104, the terminal 101 of the current proportional circuit 100 is connected to the constant current source 103 through the steering circuit 104, so that the current in proportion to the current of the terminal 101 flows the load 107 from the terminal 102 in accordance with the operation of the current proportional circuit 100, the configuration of which will be explained below in more detail.

On the other hand, when the other level signal of the switching signals is applied to the steering circuit 104, the terminal 102 of the current proportional circuit 100 is connected to the constant current source 103 therethrough, so that the current from the constant current source 103 flows the load 107 in a reverse direction. Namely, the current corresponding to the switching signals, which are an input information, is supplied to the load, in addition an output information is obtained from the terminal 106. The constant current source 103 can be of a DC type or a pluse type and the terminal 108 may be a ground potential. If the constant current source 103 is of a pulse type, the operation of this circuit is one manner of a modified principle of this invention which will be explained hereinafter.

Figure 2:
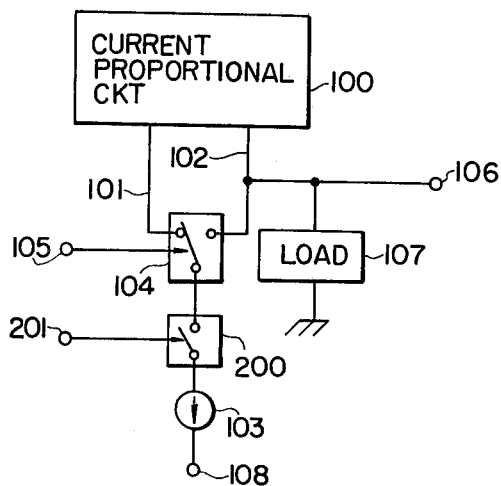
FIG. 2 is a schematic block diagram to explain a modified principle of the invention.

With respect to FIG. 2 showing a modified principle of this invention, the same elements as those in FIG. 1 are designated by the same reference numerals. A switching element 200 to which switching signals such as digital information are applied from an input terminal 201 is provided between the steering circuit 104 and the constant current source 103 in order to control the connection of the constant current source 103 to the steering circuit 104 in response to the switching signals. The operation of the steering circuit 104 is the same as that of FIG. 1. Accordingly, to the load 107, the controlled current is supplied, which is switched in a direction of a current passing therethrough by the switching signals applied to the terminal 105, and controlled by the switching signals applied to the terminal 201, in a period of time that the current passes through the load 107.

Figure 3:
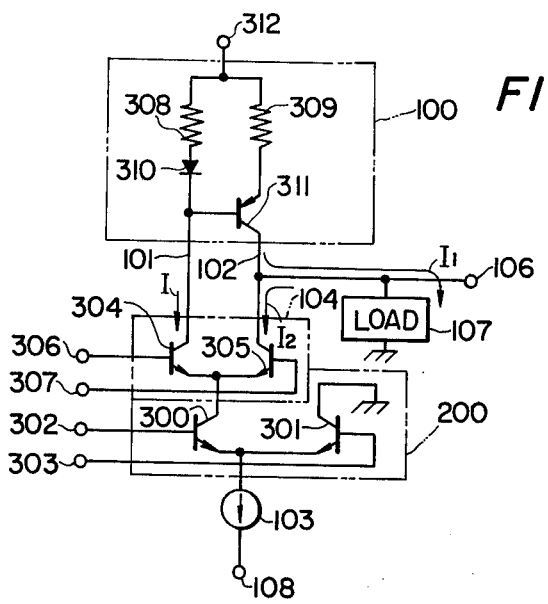
FIG. 3 is a circuit diagram of an embodiment of this invention.

FIG. 3 is an embodiment referring to a modified principle of this invention shown in FIG. 2, in which the same elements as those of FIGS. 1 and 2 are designated by the same reference numerals. The switching element 200 comprises a pair of transistors 300 and 301, the emitters of which are commonly connected to each other and coupled to the constant current source 103 and each base of which has a input terminal 302 or 303, to which a digital information is applied. The steering circuit 104 comprises a pair of transistors 304 and 305, the emitters of which are commonly connected to each other and coupled to the collector of one of a pair of transistors 300 and 301 (the collector of the transistor 300 in this embodiment) and each base of which has a input terminal 306 and 307, to which the switching signal is applied. The collectors of the pair of transistors are connected to the terminals 101 and 102, respectively. The current proportional circuit comprises resistors 308 and 309, a diode 310 and a transistor 311, for instance and is so designed that the current of the terminal 102 is in a proportional relationship with that of the terminal 101. A reference numeral 312 is a voltage terminal. In this embodiment, the PNP type transistor 311 and NPN type transistors 300, 301, 304 and 305 are used, but it is needless to say that the types of transistors can be selected by the polarity of a voltage source.

Now, the operation of this embodiment will be explained. In a case where the switching signals are applied to the input terminals 302 and 303, when the voltage of the terminal 302 is higher than that of the terminal 303, the transistor 300 is on-state to supply the current from the constant current source 103 to the steering circuit 104, whereas when the voltage of the terminal 302 is lower than that of the terminal 303, the transistor 303 is off-state so that the current is not supplied from the constant current source 103 to the steering circuit 104.

Next, in a case where the switching signals are applied to the input terminals 306 and 307, when the voltage of the terminal 306 is higher than that of the terminal 307, the transistor 304 is on-state and the transistor 305 is off-state, so that the current from the constant current source 103 is applied to the terminal 101 in response to the operation of the transistor 300, whereas when the voltage of the terminal 306 is lower than that of the terminal 307, the transistor 304 is off-state and the transistor 305 is on-state so that the current is supplied from the constant current source 103 to the load 107 in response to the operation of the transistor 300.

Assuming that the current amplification factor of the transistor 311 is sufficiently larger than 1, and the emitter-base voltage thereof and the forward voltage of the diode 310 are equal, the following equation stands when the transistors 300 and 304 are on-state.

$$I_1 = \frac{R_{308}}{R_{309}} I \quad (1)$$

where $I_1$ is the value of the current passing through the load 107, I is the value of the current from the constant current source 103 through the terminal 101, and $R_{308}$ and $R_{309}$ are the resistance values of the resistors 308 and 309, respectively.

On the other hand, when the transistors 300 and 305 are on-state, the following equation stands.

$$I_2 = -I \quad (2)$$

where $I_2$ is the value of the current passing through the load 107.

Although the embodiment of FIG. 3 is the circuit configuration corresponding to the modified principle of FIG. 2, a circuit configuration which the constant current source 103 is directly connected with the common emitters of the transistors 304 and 305 in FIG. 3 corresponds to the principle of FIG. 1. Furthermore, the constant current source 103 is a conventional one comprising a resistor or a combination of transistors and resistors, for instance.

The embodiment of FIG. 3 operates as an integration circuit when the load 107 is a capacitor. In this case, the integration circuit can be used as a digital-analog converter or a phase comparator in accordance with the relationship between the switching signals applied to the steering circuit 104 and the switching element 200.

Figure 4A:
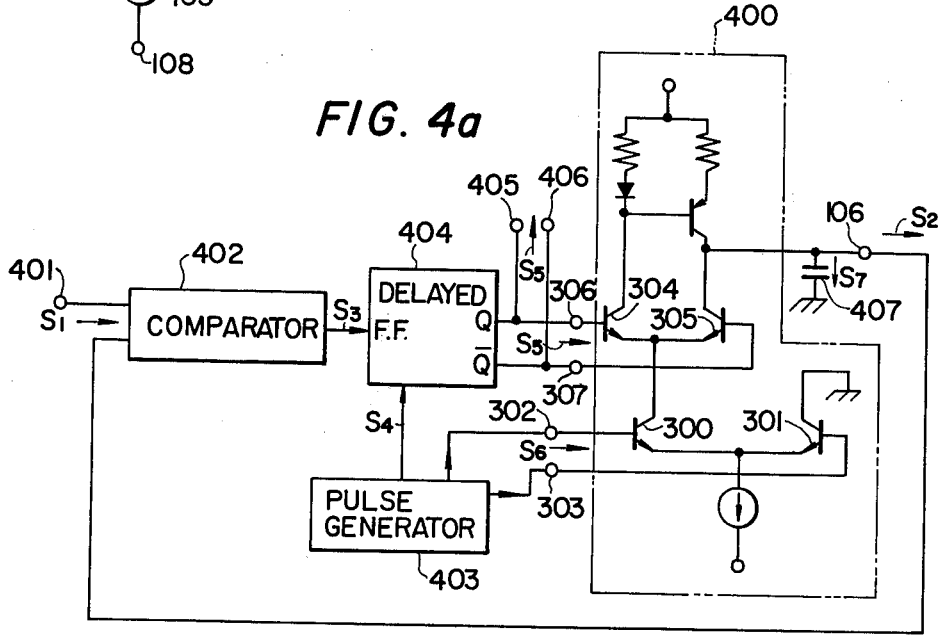
FIG. 4a is a circuit diagram of a modified embodiment of this invention.

FIG. 4a is a modified embodiment of this invention, which is a delta-modulator utilized in a communication system, to which the above integration circuit is applied.

A reference numeral 400 represents a circuit configuration corresponding to that of FIG. 3, so the detailed description thereof will be omitted.

Figure 4B:
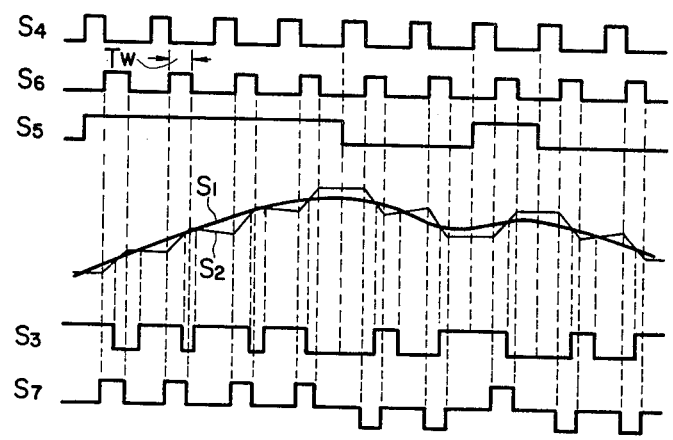

Referring to FIG. 4a in connection with FIG. 4b, an analog signal S is supplied to a comparator 402 through an input terminal 401. The other input of the comparator 402 is supplied from the output terminal 106 of the circuit 400. A signal of the output terminal 106 is shown by signal $S_2$, for instance, since the load 107 is a capacitor 407 having an integration function. The input signal S and the signal $S_2$ are compared in the comparator 402, the output signal of which is shown by a waveform $S_3$. The output signal $S_3$ of the comparator 402 and a sampling pulse signal $S_4$ from a pulse generator 403 are applied to a delayed flip-flop 404, the output of which appears from the output terminals 405 and 406. The output terminals 405 and 406 are connected to the output terminals Q and $\overline{Q}$ of the delayed flip-flop 404, respectively, and the difference signal therebetween is shown by the signal waveform $S_5$. However, it is needless to say that the output signal of the delayed flip-flop 404 can be obtained from either one of the output terminals Q and $\overline{Q}$ thereof, since the outputs from the output terminals Q and $\overline{Q}$ are similar pulse signals and are only different in polarity with respect to each other. Accordingly, the output signals from the terminals 405 and 406 are the delta-modulated signals $S_5$ converted from the input analog signal $S_1$.

The circuit 400 with the capacitor 407 is a digital-analog converter and operates so as to convert the delta-modulated signal $S_5$ into the analog signal $S_2$ as will be described here. The output signals (shown as the difference signal $S_5$) of the delayed flip-flop 404 are supplied to the bases of the transistors 304 and 305, respectively. In this case, either one of the output signals of the delayed flip-flop 404 may be supplied to the base of one of the transistors 304 and 305, while a predetermined reference voltage is applied to the base of the other transistor in such a manner that a pair of transistors 304 and 305 is switched in response to the output signal of the delayed flip-flop 404. On the other hand, a pulse signal $S_6$ from the pulse generator 403, which is shifted from the sampling pulse signal $S_4$, is supplied to between the bases of the transistors 300 and 301. Although the pulse signal $S_6$ indicates the waveform of the difference signal between the input terminals 302 and 303, a similar signal to the pulse signal $S_6$ may be supplied to only the input terminal 302 while a predetermined reference voltage is applied to the input terminal 303 in such a manner that a pair of transistors 300 and 301 is switched in response to the pulse signal supplied to the input terminal 302. As a result, a current supplied to the capacitor 407 is shown by the signal waveform $S_7$. This current is integrated by the capacitor 407 and is converted into the analog signal $S_2$.

Now, when the transistors 300 and 304 are on-state, the voltage of the capacitor 407 increases every sampling pulse by $\Delta_+$ shown in a formula (3).

$$\Delta_+ = \frac{R_{308}}{R_{309}} \cdot \frac{I \cdot T_W}{C_{407}} \qquad (3)$$

where $C_{407}$ is the capacitance of the capacitor 407 and $T_W$ is the pulse-width of the pulse signal $S_6$.

On the other hand, when the transistors 300 and 305 are on-state, the voltage of the capacitor 407 decreases every sampling pulse by $\Delta_-$ shown in a formula (4).

$$\Delta_- = \frac{I \cdot T_W}{C_{407}} \qquad (4)$$

Therefore, a step size corresponding to the increasing or decreasing factor of the voltage of the capacitor 407 in every sampling pulse can be variable in accordance with the variations of the current value I and of the pulse width $T_W$. Further, the ratio ($\Delta_+/\Delta_-$) of the step size can be defined by the ratio of the resistors 308 and 309. This is useful in practical use, because the variation of the resistance value of each resistor formed in an integrated circuit is about $\pm$ 20%, but the variation of the resistance ratio thereof is within about $\pm$ 5%. Accordingly, the delta-modulator of this invention in which the variation of the ratio of the stepsize is within several %, can be much better in characteristic than the conventional one which the variation of the stepsize ratio is in the order of 10%.

Figure 5A:
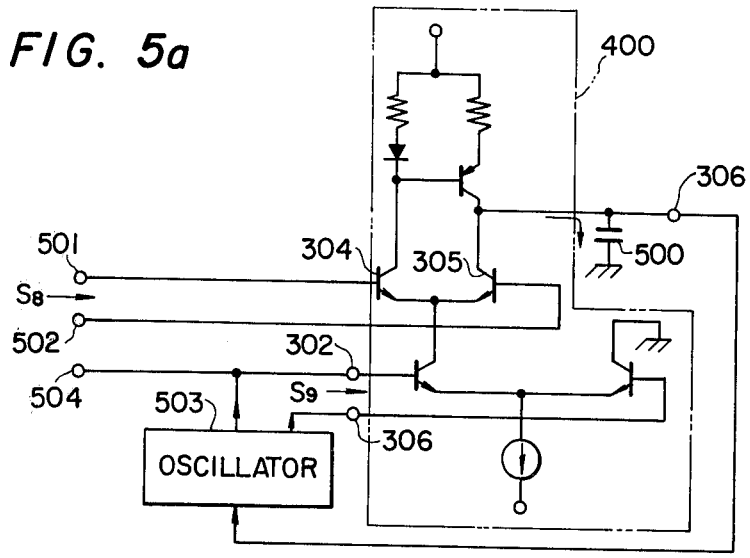
FIG. 5a is a circuit diagram of a further modified embodiment of this invention.

FIG. 5a is a frequency control oscillator of this invention, in which the circuit 400 corresponding to the embodiment shown in FIG. 3 serves as a phase comparator, where the load 107 is a capacitor 500. Input terminals 501 and 502 are of a signal $S_8$ for controlling the oscillation frequency of an oscillator 503 which is controlled by an applied voltage. The output of the oscillator 503 is obtained from an output terminal 504.

The operation of this embodiment will be explained in connection with FIG. 5b. The signal $S_8$ which is shown as a difference signal between the input terminals is applied to the bases of the transistors 304 and 305. However, as have been described above, the similar signal to the signal $S_8$ may be applied to the input terminal 501, while a predetermined reference voltage is applied to the terminal 502, of vice versa where the signal applied to the terminal 502 is different in polarity. On the other hand, a signal $S_9$ (shown by a solid line) from the oscillator 503 is applied to between the terminals 302 and 306. Accordingly, the current supplied from the circuit 400 to capacitor 500 is shown by a pulse signal $S_{10}$ shown by a solid line, so that the voltage of the capacitor 500 is obtained as a voltage waveform $S_{11}$ which operates to control the oscillation frequency of the oscillator 503 as well known.

Figure 5B:
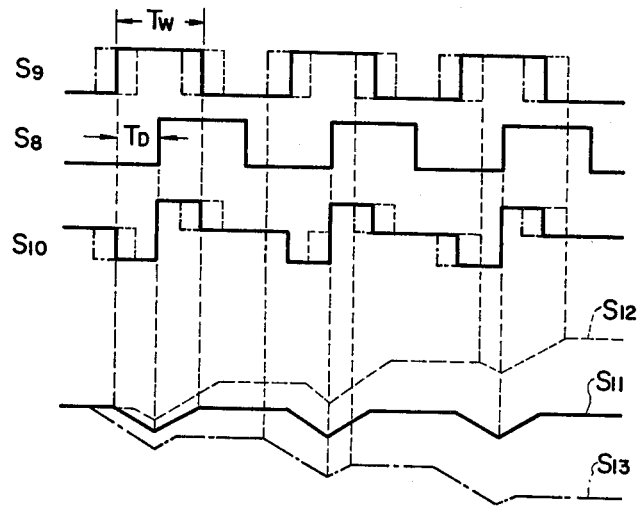

Now, the operation for controlling the oscillation frequency of the oscillator 503 will be explained. In one cycle of the pulse signal $S_9$, an electric charge $Q_1$ which the capacitor 500 is charged is represented by a formula (5).

$$Q_1 = \frac{R_{308}}{R_{309}} I(T_W - T_D) \qquad (5)$$

where $T_W$ is the pulse-width of the pulse signal $S_9$ and $T_D$ is the delay time between the pulse signals $S_8$ and $S_9$ shown in FIG. 5b. On the other hand, an electric charge $Q_2$ which the capacitor 500 is discharged, is represented by a formula (6).

$$Q_2 = - I \cdot T \qquad (6)$$

Accordingly, a voltage variation $\Delta \overline{V_c}$ of the capacitor 500 is shown by a formula (7) in one cycle.

$$\Delta \overline{V_c} = \frac{I \cdot \left\{ \frac{R_{308}}{R_{309}} \cdot T_W - \left(1 + \frac{R_{308}}{R_{309}}\right) \cdot T_D \right\}}{C_{500}} \qquad (7)$$

where $C_{500}$ is the capacitance of the capacitor 500. In the formula (7), when the delay time $T_D$ is $T_D0$ shown by a formula (8), $\Delta \overline{V_c}$ becomes 0.

$$T_D0 = \frac{\frac{R_{308}}{R_{309}}}{1 + \frac{R_{308}}{R_{309}}} \cdot T_W \qquad (8)$$

Therefore, the circuit constants of the oscillator 503 and the circuit 400 are so designed that the voltage valiation $\Delta \overline{V_c}$ becomes 0 as shown by the formulas (7) and (8), when the frequency $f_i$ of the pulse signal $S_8$ is equal to the frequency $f_o$ of the pulse signal $S_9$, so that the voltage of the capacitor 500 is shown by the waveform $S_{11}$ in FIG. 5b. Now, in general, to change the frequency results a changing phase. Accordingly, when $f_o < f_i$ as shown by a dotted line of the pulse signal $S_9$, for instance, $T_D$ is smaller than $T_D0$ so that $\Delta \overline{V_c} > 0$ is obtained from the formula (7), which is shown by a waveform $S_{12}$ in FIG. 5b, whereas when $f_o > f_i$ as shown by a dot-dash-line of the pulse signal $S_9$, for instance, $T_D$ is larger than $T_D0$ so that $\Delta \overline{V_c} > 0$ therefrom, which is shown by a waveform $S_{13}$ in FIG. 5b. As a result, in accordance with the relationship between the input frequency $f_i$ and the output frequency $f_o$, the voltage variation $\Delta \overline{V_c}$ of the capacitor 500 is:

| | | | |
|---|---|---|---|
| i) | $f_o < f_i$ | : $\Delta V_c > 0$ (shown by $S_{12}$) | |
| ii) | $f_o = f_i$ | : $\Delta V_c = 0$ (shown by $S_{11}$) | (9) |
| iii) | $f_o > f_i$ | : $\Delta V_c < 0$ (shown by $S_{13}$) | |

The oscillator 503 which the voltage variation is fed back from the capacitor 500, operates so as to compensate the voltage variation, so that the frequency compensated output is obtained from the output terminal 504.

Figure 6A:
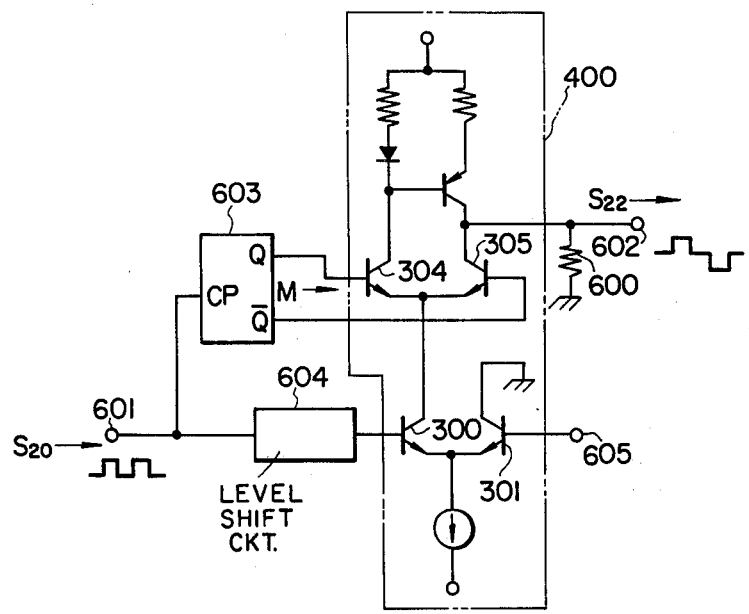
FIG. 6a is a circuit diagram of a still further modified embodiment of this invention.

FIG. 6a is an unipolr-bipolar pulse converter of this invention, in which the circuit 400 corresponds to the embodiment shown in FIG. 3, wherein the load 107 is a resistor 600. An input terminal 601 is of a unipolar pulse sequence and an output converted into a bipolar pulse sequence is obtained from an output terminal 602. Reference numerals 603 and 604 designate a flip-flop circuit and a level shift circuit, respectively.

Figure 6B:
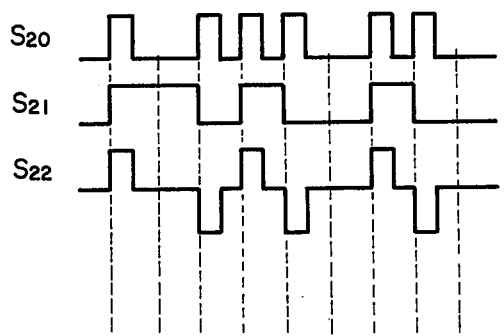

Now, the operation of this embodiment of this invention will be explained in connection with FIG. 6b. An unipolar pulse sequence $S_{20}$ corresponding to a digital information P is supplied to the input terminal 601 which is connected with the flip-flop and the level shift circuits 603 and 604. The output terminals Q and $\overline{Q}$ are connected with the bases of transistors 304 and 305, respectively, each output of which is supplied to each base of the transistors 304 and 305, where the difference signal supplied to between the bases of the transistors 304 and 305 is shown by a waveform $S_{21}$. Although the two outputs of the flip-flop circuit 603 are utilized as the switching signal of a pair of transistors 304 and 305, one output of the flip-flop circuit 603 may be utilized to supply to the base of the transistor 304, for instance, while a predetermined reference voltage is applied to the base of the transistor 305 is such a manner that a pair of transistors 304 and 305 is switched in response to the output signal supplied to the base of the transistor 304.

On the other hand, the unipolar pulse sequency $S_{20}$ is supplied to the base of the transistor 300 through the level shifter 603. A predetermined reference voltage is applied to the base terminal 605 of the transistor 301, which is so selected that the transistor 300 is on-state when the unipolar pulse sequence $S_{20}$ maintains high level. The level shifter 603 may be omitted, if the relationship between the unipolar pulse sequence $S_{20}$ and the predetermined reference voltage is suitable. As a result, a bipolar pulse sequence $S_{22}$ is obtained from the output terminal 602. It has been impossible that a conventional unipolar-bipolar converter is composed by an integrated circuit since a transformer has been utilized therein. However, the unipolar-bipolar pulse converter of this invention can be formed by the integrated circuit.

In the above embodiments, transistors and general switching elements are applicable to the steering circuit and the switching circuit.

While only a few forms of the present invention have been shown and described, many modifications will be apparent to those skilled in the art within the spirit and the scope of the invention as set forth in the appended claims.

We claim:
1. A current control circuit comprising:
   first means, having first and second terminals, for controlling currents such that the current flowing into the first terminal is in a proportional relationship with the current flowing into the second terminal;
   second means, connected between the first terminal of said first means and a common potential terminal, from which an output signal is delivered;
   third means for supplying a constant current to each of said first and second terminals; and
   fourth means connected between said first and third means for selectively steering the constant current from said third means to one of said first and second terminals of said first means in response to a first digital input information signal applied to said fourth means.

2. A current control circuit according to claim 1, further including fifth means provided between said third means and said fourth means to interrupt the current supplied from said third means to said fourth means in response to a second digital input information signal applied to said fifth means.

3. A current control circuit according to claim 2, wherein said fourth means comprises a pair of transistors, each emitter of which is commonly connected to each other, and each collector of which is coupled with said respective terminals of said first means, said first digital input information signal supplied to the bases of said transistors in such a manner that said pair of transistors is switched in response to said first digital input information signal, and said fifth means comprises another pair of transistors, each emitter of which is commonly connected to each other and connected with said third means, and the collector of one of which is coupled with said common emitter of said fourth means while the other collector is connected to said common potential terminal, said second digital input information signal supplied to the bases of said another pair of transistors is swiched in response to said second digital input information signal.

4. A current control circuit according to claim 2, further including sixth means coupled with said fourth means, for outputting a delta-modulated signal, seventh means coupled with said fifth means, for supplying said second digital information signal which is pulse signal to said fifth means, eighth means connected to said second means which comprises a capacitor, for comparing an input analog signal with the output signal of said second means, and nineth means for generating said delta-modulated signal, to which the output of said eighth means and the pulse signal of said seventh means are supplied, the output terminal of said nineth means coupled with said sixth means whereby the analog signal is converted into the delta-modulated signal.

5. A current control circuit according to claim 2, further including an oscillator, the output frequency of which is controlled by an applied voltage, the output of said oscillator applied to said fifth means to be switched thereby, said second means which comprises a capacitor coupled to said oscillator to control the frequency thereof, and said first digital input information signal is a pulse signal sequence for controlling the frequency of said oscillator.

6. A current control circuit according to claim 2, further including a flip-flop circuit, the output of which is supplied to said fourth means, an input terminal, connected with said flip-flop circuit and said fifth means, said input terminal supplying a unipolar pulse sequence thereto, and a resistor which comprises said second means, whereby the unipolar pulse sequency is converted into a bipolar pulse sequency.

7. A current control circuit according to claim 1, wherein said first means conprises:
   a power supply having an output terminal,
   a diode and first resistor connected serially between said power supply terminal and said second terminal of said first means,
   a transistor having a base, collector and emitter of which the base, collector and emitter are connected respectively to said second terminal of the first means, said first terminal of the first means and the power supply output terminal.

* * * * *